United States Patent [19]
Parthasarathi et al.

[11] Patent Number: 5,952,083
[45] Date of Patent: Sep. 14, 1999

[54] ALUMINUM ALLOYS FOR ELECTRONIC COMPONENTS

[75] Inventors: Arvind Parthasarathi, North Branford; Satish Jalota, Wallingford, both of Conn.; Jeffrey Schlater; Lynn Strauman, both of Oakdale, Calif.; Jeffrey S. Braden, Livermore, Calif.

[73] Assignee: Advanced Technology Interconnect, Inc., Manteca, Calif.

[21] Appl. No.: 08/955,191

[22] Filed: Oct. 21, 1997

[51] Int. Cl.⁶ .................................................. H01L 23/52
[52] U.S. Cl. ............................................ 428/209; 257/691
[58] Field of Search ................................. 428/209, 650, 428/647; 257/691

[56] References Cited

U.S. PATENT DOCUMENTS

| | | |
|---|---|---|
| 4,491,622 | 1/1985 | Butt . |
| 4,888,449 | 12/1989 | Crane et al. . |
| 4,939,316 | 7/1990 | Mahulikar et al. . |
| 5,013,871 | 5/1991 | Mahulikar et al. . |
| 5,015,803 | 5/1991 | Mahulikar et al. . |
| 5,403,975 | 4/1995 | Pasqualoni et al. . |
| 5,534,356 | 7/1996 | Mahulikar et al. . |
| 5,578,869 | 11/1996 | Hoffman et al. ......................... 257/691 |
| 5,629,835 | 5/1997 | Mahulikar et al. . |
| 5,650,592 | 7/1997 | Cheskis et al. . |
| 5,650,663 | 7/1997 | Parthasarathi . |

*Primary Examiner*—Deborah Jones
*Assistant Examiner*—Darlene David
*Attorney, Agent, or Firm*—Gregory S. Rosenblatt; Wiggin & Dana

[57] ABSTRACT

Anodizable components for electronic packaging applications, such as substrates for printed circuit boards or ball grid array electronic packages, having conductive circuitry formed on an electrically non-conductive anodic film. To inhibit the formation of electrically conductive precipitates in the anodic film that can form an electrical short circuit between the circuit traces and the metallic core of the component, the metallic core is formed from an anodizable alloy having below thresholds of precipitate forming constituents. Such precipitate forming constituents include iron, silicon and manganese.

15 Claims, 2 Drawing Sheets

ALUMINUM ALLOYS FOR ELECTRONIC COMPONENTS

BACKGROUND OF THE INVENTION

1. Field of the Invention

This invention relates to anodized aluminum substrates for electronic package and printed circuit board applications. More particularly, the electrically isolating integrity of an anodic film is enhanced by forming the film from an aluminum alloy having less than threshold amounts of precipitate forming elements including iron, silicon and manganese.

2. Description of the Related Art

Anodized aluminum substrates are used as components in packages that encase electronic devices as disclosed in U.S. Pat. No. 4,939,316 to Mahulikar et al, that is incorporated by reference in its entirety herein. The U.S. Pat. No. 4,939,316 patent discloses an adhesively sealed electronic package having anodized aluminum base and cover components. A leadframe is disposed between and bonded to both the base and cover. A silicon-based semiconductor integrated circuit is bonded either to the package base or to an intervening die paddle.

Electronic package designers have begun to replace the leadframe with circuitry deposited directly on a dielectric layer by processes such as direct writing, screen printing, electrolytic plating, electroless plating, vaporization, sputtering and vapor deposition. A ball grid array electronic package having circuitry deposited on an anodic film is disclosed in U.S. Pat. No. 5,629,835 by Mahulikar et al, that is incorporated by reference in its entirety herein. The circuitry is electrically isolated from a metallic aluminum alloy core by the anodic film. Defects in the anodic film may create an electrically conductive path from the metallic substrate to the surface of the anodic film. If an electrically conductive path develops, an electrical short circuit between the metallic core and the deposited circuitry is likely.

U.S. Pat. No. 5,534,356 to Mahulikar et al, that is incorporated by reference in its entirety herein, discloses that the break-down voltage of an anodized aluminum component may be increased by proper selection of the aluminum alloy core. The break-down voltage is the voltage that when applied across a dielectric layer, such as the anodic film, causes an irreversible degradation of that dielectric layer and is accompanied by an increase in electrical conductivity of several orders of magnitude. The patent discloses forming the core from aluminum alloys of the 1000, 5000 and 6000 series as designated by the Aluminum Association Incorporated.

The 1000 series alloys are 99%, by weight, or higher aluminum.

The 5000 series alloys contain magnesium and usually chromium as well.

The 6000 series alloys contain silicon and magnesium in approximate proportions to form magnesium silicide.

There remains, however, a need for aluminum alloy components for electronic packages that inhibit the formation of electrically conductive paths through an anodic film that may result in electrical short circuits between circuitry deposited on a surface of the anodic film and a metallic aluminum core.

SUMMARY OF THE INVENTION

Accordingly, it is an object of the invention to provide a component for an electronic assembly that reduces electrical short circuits between a metallic core and circuitry formed on a surface of the anodic film. It is a feature of the invention that the core is selected to be an aluminum material having less than threshold amounts of precipitate forming alloying additions including iron, silicon and manganese. It is an advantage of the invention that the absence of these precipitate forming elements reduces the density and size of conductive intermetallic particles dispersed in anodic film and reduces the likelihood of electrical short circuit through the film.

The components of the invention are particularly suitable for electronic applications such as substrates for ball grid array electronic packages, substrates for pin grid electronic packages and printed circuit board substrates.

In accordance with the invention, there is provided a component for an electronic assembly. The component has an anodizable core formed from an anodizable alloy. Precipitate forming constituents of the alloy are present in less than an amount effective to form electrically conductive intermetallic paths through an anodic film that at least partially coats the anodizable core. A conductive layer is directly deposited on the anodic film.

The above stated objects, features and advantages will become more apparent from the specification and drawings that follow.

IN THE DRAWINGS

DETAILED DESCRIPTION

Figure 1:
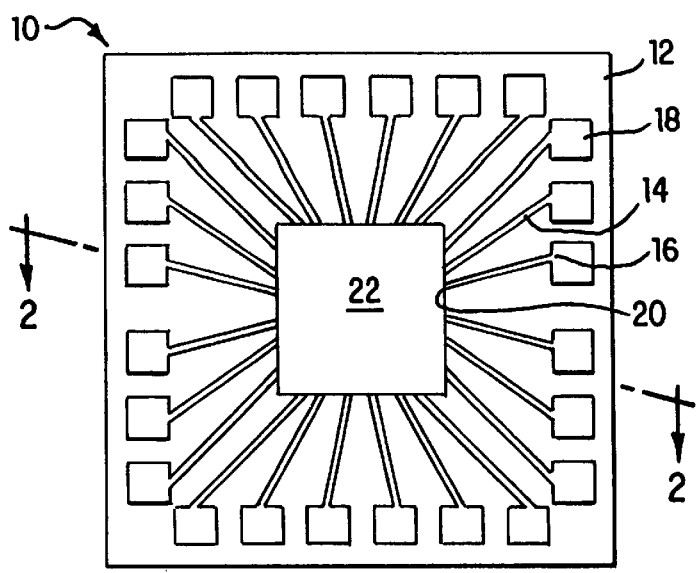
FIG. 1 shows in top planar view an electronic component in accordance with the invention.

FIG. 1 shows in top planar view a component 10 for an electronic assembly. This component 10 may be utilized as a base for a ball grid array electronic package, a pin grid array electronic package, a lead-less electronic package, a leadframe containing package, printed circuit board, or the like. The component 10 has an electrically non-conductive surface 12 on which are deposited conductive circuit traces 14. Preferably, the conductive circuit traces 14 are deposited directly on the non-conductive layer 12, without an intervening layer such as an adhesive or polymer dielectric.

Peripheral ends 16 of the conductive circuit traces 14 terminate at bond pads 18. The bond pads 18 typically receive a solder ball (for a ball grid array electronic package) or a conductive pin (for a pin grid array electronic package). Opposing inner ends 20 of the conductive circuit traces 14 typically terminate at a central portion 22 of the component 10. Typically, one or more semiconductor devices or other electronic components are mounted to the central portion 22 and electrically interconnected to the inner ends 20 of the conductive circuit traces 14.

Figure 2:
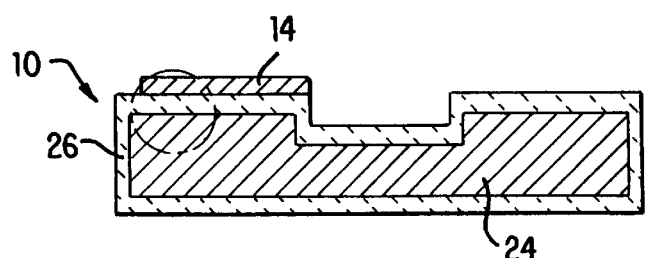
FIG. 2 shows in cross-sectional view the component of FIG. 1.

As shown in cross-sectional representation in FIG. 2, the component 10 has a core 24 formed from an anodizable metal such as aluminum, titanium, magnesium and alloys of those metals that contain at least 80%, by weight, of anodizable constituents.

An anodic film 26, having a typical thickness of between 0.0005 inch and 0.003 inch, coats at least that portion of the core 24 that underlies the conductive circuit traces 14. The anodic film is formed from the core by an electrolytic process. One process, integral color anodization, is disclosed in U.S. Pat. No. 5,066,368 to Pasqualoni et al, that is incorporated by reference in its entirety herein. An aluminum alloy is immersed in an aqueous electrolyte that contains between 1 and 4 grams per liter of sulfuric acid and between 50 and 120 grams per liter of sulfosalicylic acid. A direct electric current is then impressed across the electrolyte with the aluminum alloy as the anode for a time effective to form an anodic film of a desired thickness.

Figure 3:
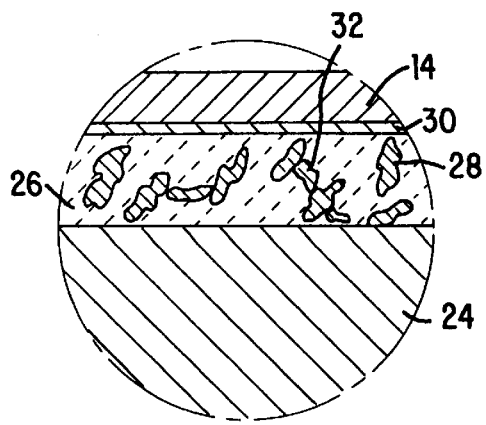
FIG. 3 shows in magnified cross-sectional view a defect with prior art components.
Figure 4:
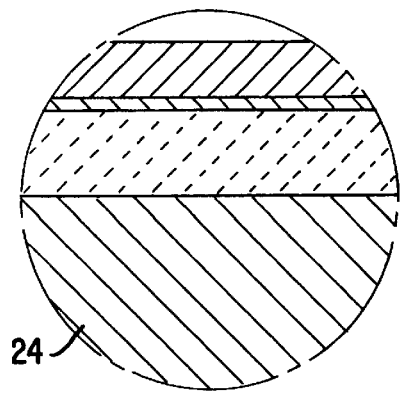
FIG. 4 shows in magnified cross-sectional view the component of the invention.

The broken circle region of FIG. 2 is shown in magnified cross-section in FIGS. 3 and 4. In FIG. 3, the core 24 is formed from a conventional aluminum alloy that contains above a threshold amount of precipitate forming constituents. While iron, silicon and manganese are the most common of the precipitate forming constituents, the amounts of other precipitate forming constituents should also be controlled. The precipitate forming constituents form precipitates 28 of non-anodizable, electrically conductive, intermetallics in the anodic film 26. Among the precipitates that may form are Al—Fe—Si, $FeAl_3$ and $MnAl_6$.

An electrically conductive metallization layer 30 having a thickness on the order of about 100 to 5000 angstroms is deposited on the anodic film by a vapor deposition process such as sputtering. Suitable metallization layers are formed from chromium, titanium, copper, and alloys thereof.

Using conventional photolithographic techniques, the metallization layer is patterned into the conductive circuit traces. The thickness of the circuit traces 14 is increased by electroplating copper onto the remainder portion of the metallization layer.

If the precipitates 28 form a path that extends through the anodic film 26, an electrical short circuit 32 may develop between the metallization layer 30 and the core 24. The short circuit 32 will electrically short the conductive circuit trace 14, rending the component useless.

With reference to FIG. 4, if the core 24 is formed from an anodizable metal that resists the formation of precipitates 28, then the risk of an electrical short circuit is significantly reduced. This is achieved by selecting the core 24 to be an alloy containing below threshold amounts of precipitate forming constituents. Preferably, the contents of iron and silicon are each below about 0.25% and the manganese content below about 0.5%. More preferably, the iron and silicon contents are below about 0.1% and the manganese content below about 0.2%. In a most preferred embodiment, the iron and silicon contents are both below about 0.05% and the manganese content below about 0.15%.

Suitable aluminum alloys include aluminum alloy 1199, aluminum alloy C378 and aluminum alloy C276. The chemical compositions of these alloys are, by weight, as follows:

Aluminum alloy 1199—99.99% aluminum minimum.

Aluminum alloy C276—3.8%–4.8% magnesium, 0.1%–0.3% zinc, balance aluminum.

Aluminum alloy C378—4.8%–5.8% magnesium, 0.1%–0.3% zinc, balance aluminum.

To prevent damage to the components during processing, the components should have a room temperature yield strength of at least 15 ksi, and preferably the yield strength should be in excess of about 20 ksi. This limits the usefulness of aluminum alloy 1199 as a core material since the yield strength, depending on processing is between 6.5 ksi and 17.5 ksi.

Figure 5:
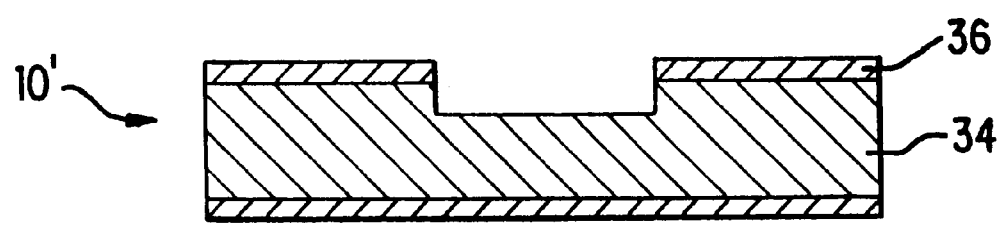
FIG. 5 shows in cross-sectional representation a second component in accordance with the invention.

However, since precipitation formation is a surface effect due to interaction with the electrolyte, composite components are useful. As illustrated in FIG. 5, a composite component 10' has a rigid central portion 34 and at least one precipitation resisting outer layer 36 bonded to the rigid portion, such as by cladding.

The rigid central portion 34 has a room temperature yield strength in excess of 15 ksi and a less rigid, precipitation resisting outer layer 36 clad to one or both sides. For example, the central portion 34 could be aluminum alloy 3003 having a nominal composition by weight of 0.05%–0.20% copper, 1.0%–1.5% manganese and the balance aluminum with a room temperature yield strength of, depending on temper, between 16 ksi and 29 ksi. The outer layers 36 could then be aluminum alloy 1199.

Typically, to prevent flexing due to a mismatch in the coefficients of thermal expansion, the outer layers 36 are bonded to both sides of the central portion 34. Preferably, both the central portion 34 and the outer layers 36 are formed from the same base material, such as aluminum. The central portion 34 is selected to be a relatively rigid material having a yield strength in excess of about 20 ksi, and preferably in excess of about 30 ksi.

The outer layers 36 are relatively thin, when clad, on the order of from about 0.00012 inch to about 0.001 inch (3 to 25 microns), and preferably on the order of from about 0.0002 inch to about 0.0006 inch (5 to 15 microns) in thickness and formed from an aluminum alloy that resists the formation of precipitate such as aluminum alloy 1199. The strength for the component is provided by the central portion 34 and precipitate formation resistance by the outer layers.

Alternatively, the outer layers 36 are deposited by a process such as sputtering, electroplating or vapor deposition. Such a deposited coating has a composition as described above for the cladding layers and a thickness of from about 0.0001 inch to 0.002 inch. More preferably, the thickness is in the range of from about 0.0002 inch to 0.0007 inch.

The following Example illustrates the advantages of the present invention.

EXAMPLE

Aluminum alloy coupons having dimensions of 3 inches by 2 inches by 0.05 inch and the analyzed compositions specified in Table 2 were anodized in accordance with U.S. Pat. No. 5,066,368 to form an anodic film with a thickness of between 0.0008 and 0.001 inch.

The anodized coupons were immersed in a copper plating bath at room temperature (nominally 23° C.). The copper plating bath was developed to have both chemical compatibility with the anodization layer, to resist anodic film etching and dissolution, and also pH compatibility with the anodization layer. One suitable electrolyte was an aqueous solution consisting essential of 10%, by volume, of copper sulfate pentahydrate in 10% methane sulfonic acid. The pH of the electrolyte was adjusted to 0.5±0.2. While not necessary, the electrolyte may further contain desired additives including surfactants and wetting agents.

The key component for this electrolyte is a pH compatible with the anodization layer. The aqueous solution may contain from about 5% to about 15%, by volume, of copper sulfate pentahydrate in from about 5% to about 15% methane sulfonic acid as long as the pH is adjusted appropriately.

An electrochemical cell was created with platinized titanium as anodes and the anodized samples being made the cathode. A conductive via was formed through one spot on the anodized samples to provide electrical continuity with the core of the anodized coupon. Two copper cathodes were used on either side of the anodized coupon to carry the bulk of the current. A voltage of 2.2 volts was then applied for a total of 10 minutes.

Electrical short circuits through the anodic film were manifest as copper deposits at the surface. These copper deposits are easily visible through an optical microscope.

TABLE 2

| Alloy | ~% Al | % Mg | % Cu | % Zn | % Mn | % Fe | % Si | % Other |
|---|---|---|---|---|---|---|---|---|
| 1100 | 99.99 | | 0.12 | 0.1 | | 1.0 Si + Fe | | |
| 3003 | 98 | | 0.2 | 0.1 | 1.5 | 0.7 | 0.6 | |
| 5052 | 96 | 2.8 | 0.1 | 0.1 | 0.1 | 0.4 | 0.25 | 0.35 Cr |
| 5086 | 94 | 4.5 | 0.1 | 0.25 | 0.7 | 0.5 | 0.4 | 0.25 Cr 0.15 Ti |
| 6061 | 97 | 1.2 | 0.4 | 0.25 | 0.15 | 0.7 | 0.8 | 0.35 Cr 0.15 Ti |
| 1199 | 99.99 | | | | 0.002 | 0.006 | 0.006 | |
| C378 | 95 | 5.3 | 0.15 | 0.22 | 0.1 | 0.03 | 0.03 | 0.1 Cr 0.15 Zr |
| C276 | 96 | 4.3 | 0.15 | 0.22 | 0.1 | 0.03 | 0.03 | 0.1 Cr |

The surfaces of coupons were then examined under an optical microscope at 500 times magnification with each sample being randomly scanned for a total of 3 minutes and the total number of copper plated spots recorded below in Table 3. Table 3 illustrates that surface plating, indicative of an electrical short circuit, is avoided when the manganese, iron and silicon contents are below the thresholds specified above.

TABLE 3

| Alloy | % Mn* | % Fe* | % Si* | Copper nodules observed in 3 min. |
|---|---|---|---|---|
| 1100 | | 1.0 Si + Fe | | 35 |
| 3003 | 1.5 | 0.7 | 0.6 | 31 |
| 5052 | 0.1 | 0.4 | 0.25 | 62 |
| 5086 | 0.7 | 0.5 | 0.4 | 29 |
| 6061 | 0.15 | 0.7 | 0.8 | 130 |
| 1199 | 0.002 | 0.006 | 0.006 | 0 |
| C378 | 0.009 | 0.023 | 0.013 | 0 |
| C276 | 0.01 | 0.021 | 0.014 | 0 |

It is apparent that there has been provided in accordance with the present invention an anodizable substrate that resists the formation of electrical short circuits that fully satisfies the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A component for an electronic assembly, comprising:
   an anodizable substrate formed from a base alloy selected from the group consisting of aluminum, titanium and manganese that further contains alloying constituents wherein iron and silicon are present in an amount of less than about 0.25%, by weight, each, and manganese is present in an amount of less than about 0.5%, by weight;
   an anodic film at least partially coating said anodizable substrate; and
   a plurality of conductive members directly bonded to said anodic film.

2. The component of claim 1 wherein the amount of iron and silicon is less than about 0.1%, by weight, and the amount of manganese is less than about 0.2%, by weight.

3. The component of claim 2 wherein the amount of iron and silicon is less than about 0.05%, by weight, and the amount of manganese is less than about 0.15%, by weight.

4. The component of claim 2 wherein said conductive members have a thickness of between 100 angstroms and 5000 angstroms.

5. The component of claim 4 wherein said conductive members are circuit traces extending from peripherally disposed bond pads to a central portion of said component.

6. The component of claim 5 wherein said anodizable substrate is an aluminum base alloy.

7. The component of claim 6 wherein said aluminum base alloy is selected from the group consisting of aluminum alloy 1199, aluminum alloy C276 and aluminum alloy C378.

8. The component of claim 2 wherein said aluminum base alloy is selected from the group consisting of aluminum alloy 1199, aluminum alloy C276 and aluminum alloy C378.

9. A component for an electronic assembly, comprising:
   a composite substrate having a central portion with a room temperature yield strength in excess of 15 ksi and at least one anodizable outer layer bonded to said composite substrate wherein said anodizable outer layer is formed from a base alloy selected from the group consisting of aluminum, titanium and manganese that further contains alloying constituents wherein iron and silicon are present in an amount of less than about 0.25%, by weight, each, and manganese is present in an amount of less than about 0.5%, by weight;
   an anodic film at least partially coating said anodizable outer layer; and
   a plurality of conductive members directly bonded to said anodic film.

10. The component of claim 9 wherein the amount of iron and silicon is less than about 0.1%, by weight, and the amount of manganese is less than about 0.2%, by weight.

11. The component of claim 10 wherein the amount of iron and silicon is less than about 0.05%, by weight, and the amount of manganese is less than about 0.15%, by weight.

12. The component of claim 10 wherein said outer layers have a thickness of from about 0.0001 inch to about 0.001 inch.

13. The component of claim 12 wherein said conductive members are circuit traces extending from peripherally disposed bond pads to a central portion of said component.

14. The component of claim 13 wherein said anodizable outer layer is an aluminum base alloy.

15. The component of claim 14 wherein said aluminum base alloy is selected from the group consisting of aluminum alloy 1199, aluminum alloy C276 and aluminum alloy C378.

* * * * *